United States Patent
Farquhar et al.

(10) Patent No.: US 6,429,527 B1
(45) Date of Patent: Aug. 6, 2002

(54) METHOD AND ARTICLE FOR FILLING APERTURES IN A HIGH PERFORMANCE ELECTRONIC SUBSTRATE

(75) Inventors: Donald S. Farquhar; Konstantinos I. Papathomas, both of Endicott, NY (US)

(73) Assignee: International Business Corporation, Armonk, NY (US)

( * ) Notice: Subject to any disclaimer, the term of this patent is extended or adjusted under 35 U.S.C. 154(b) by 0 days.

(21) Appl. No.: 09/764,047

(22) Filed: Jan. 17, 2001

(51) Int. Cl.$^7$ .............................................. H01L 29/78
(52) U.S. Cl. ........................................ 257/774; 257/773
(58) Field of Search ................................. 257/774, 723

(56) References Cited

U.S. PATENT DOCUMENTS

| | | |
|---|---|---|
| 4,862,323 A | 8/1989 | Butt |
| 5,481,795 A | 1/1996 | Hatakeyama et al. |
| 5,483,421 A | 1/1996 | Gedney et al. |
| 5,557,844 A | 9/1996 | Bhatt et al. |
| 5,567,982 A * | 10/1996 | Bartelink |
| 5,766,670 A | 6/1998 | Arldt et al. |
| 5,887,345 A | 3/1999 | Kulesza et al. |
| 5,920,123 A | 7/1999 | Moden |
| 6,106,891 A | 8/2000 | Kulesza et al. |
| 6,114,019 A | 9/2000 | Bhatt et al. |
| 6,365,974 B1 * | 4/2002 | Abbott et al. |
| 6,376,292 B1 * | 4/2002 | Youn et al. |

OTHER PUBLICATIONS

IBM Technical Disclosure Bulletin, Vaccum Trench Filling Process For Semiconductor and Packaging Device Fabrication, pp. 6033–6034, Mar. 1985.

* cited by examiner

*Primary Examiner*—Stephen D. Meier
(74) *Attorney, Agent, or Firm*—Schmeiser, Olsen & Watts; Lawrence R. Fraley

(57) ABSTRACT

The present invention provides a method of filling an at least one aperture in a semiconductor substrate by placing a sacrificial carrier structure on a surface of the substrate, wherein the structure comprises, a first layer, a fill material over the first layer, and a mask over fill material having at least one opening therein, such that the opening at least partially aligns with the aperture in the substrate. Thereafter, the fill material is forced into the aperture by the application of heat and pressure, and the sacrificial carrier structure is removed.

7 Claims, 3 Drawing Sheets

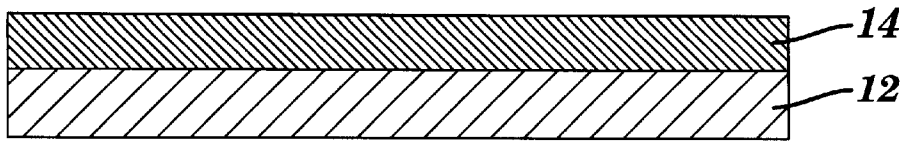
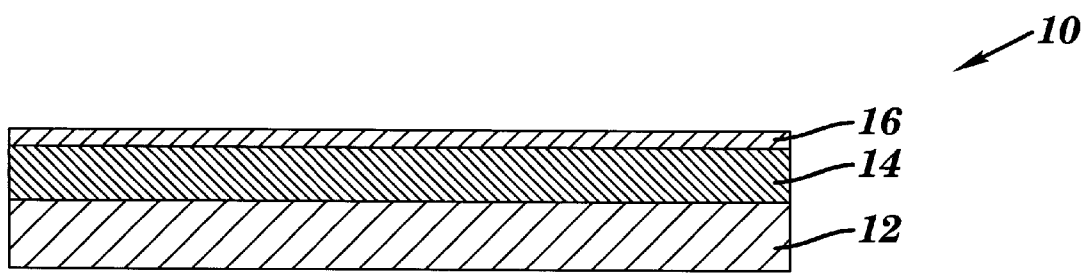
FIG. 1
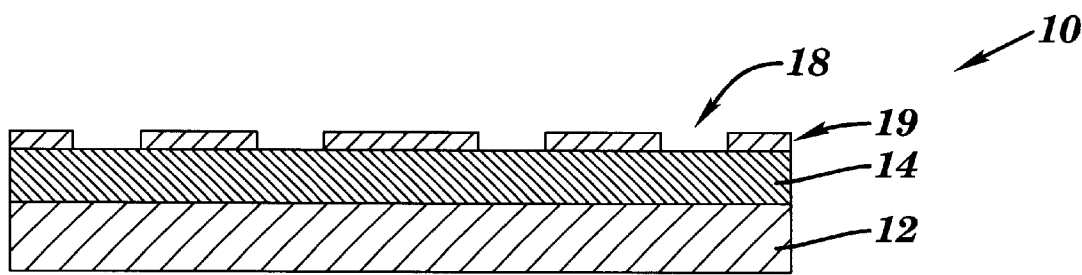
FIG. 2
FIG. 3

METHOD AND ARTICLE FOR FILLING APERTURES IN A HIGH PERFORMANCE ELECTRONIC SUBSTRATE

BACKGROUND OF THE INVENTION

1. Technical Field

The present invention relates generally to semiconductor processing, and more particularly, to a method and structure used to fill apertures in high performance electronic substrates.

2. Related Art

In circuit board construction, solder ball connection of a module, such as a ceramic module, provides significant electrical performance advantage over conventional pin-in-hole technology. Pin-in-hole technology involves the attachment of modules to circuit boards using projections or pins which insert into corresponding holes in the board.

Pin-in-hole connections, due to mechanical considerations, occupy considerable surface area of the circuit board thwarting further miniaturization. In contrast, solder ball technology attaches modules to the board using balls of solder on the module which are joined to corresponding contact points on the surface of the board.

Specifically, a high melting point solder ball is placed on the backside of a module and attached to the module with a low melting point solder paste reflow process. The module is then attached to the surface of the circuit board with a screened, low melting point solder paste. Since attachment of the module to the board is made only on the surface of the board, the attachment land drill diameter, and clearance land sizes may be reduced in size, thus allowing greater wiring area. Solder ball connection provides the advantage of enhanced system speed because the signal net length is reduced and also provides the advantage of enhanced wiring capability due to reduced via and land diameters.

However, a problem with solder ball connect technology occurs where the solder ball connection is being made to a conventional through hole or via. When such a connection has been attempted, the screened eutectic paste used to connect the solder ball to the board flows through the hole away from the intended inter-connection site during the reflowing process.

This results in poor and unreliable solder joints. One attempt to attach a module directly to a via in pad type of land was to pre-fill the through holes with solder to create a solid land prior to attachment of the solder ball. However, the solder is pulled down through the hole, away from the interconnection during the assembly of the circuit board. This pulling down or "wicking" of the solder results in a void below the ball which leads to cracking and thus produces poor, unreliable solder joints.

Another solution to the problem of connecting solder balls to through holes has been to utilize a "dog-bone" type termination where a solid copper land is displaced from the plated through hole or via. The solder joint is made to the solid copper land which is then connected by a circuit line to the via or through hole. While the dog bone termination provides excellent solder joints, it decreases the advantages otherwise obtained with the via in pad solder ball connection technology because the wireability is reduced and the signal line length is increased. Concomitantly, the circuit line occupies space or "real estate" on the surface of the circuit board.

Attempts have also been made to fill vias and through holes with certain polymer materials, but such polymer materials incompletely fill the vias thereby creating significant voids. Such polymer materials also require lengthy processing time due to drying of the solvent. These polymer materials also tend to shrink as the solvent is released, thus causing non-planar surfaces and additional voids.

It would be desirable to have solder ball connections directly at through holes thereby consuming less real estate, decreasing signal line length and increasing wireability and yet exhibiting satisfactory solder joints.

SUMMARY OF THE INVENTION

A first general aspect of the present invention provides a method of filling at least one aperture in a substrate comprising: providing a substrate having a top surface and a bottom surface; providing at least one aperture in the substrate, the aperture extending from the top surface to the bottom surface; providing a filling structure having a first layer, a fill material over the first layer, and a mask over the fill material with at least one opening therethrough; placing the filling structure on the top surface of the substrate; and forcing the fill material through the at least one opening in the mask of the filling structure into the at least one aperture of the substrate.

A second general aspect of the present invention provides a method of forming a structure used to fill an at least one aperture in a substrate, comprising: providing a first layer; depositing a fill material over the first layer; and forming a mask over the fill material.

A third general aspect of the present invention provides a structure used to fill an at least one aperture within a semiconductor substrate, comprising: a first layer; a layer of fill material over the first layer; and a mask over the layer of fill material.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein:

FIG. 1 depicts a carrier structure in accordance with the present invention;

FIG. 2 depicts the carrier structure of FIG. 1 having a foil layer thereon in accordance with the present invention;

FIG. 3 depicts the carrier structure of FIG. 2 after a mask is formed within the foil layer in accordance with the present invention;

DESCRIPTION OF THE PREFERRED EMBODIMENTS

Figure 4:
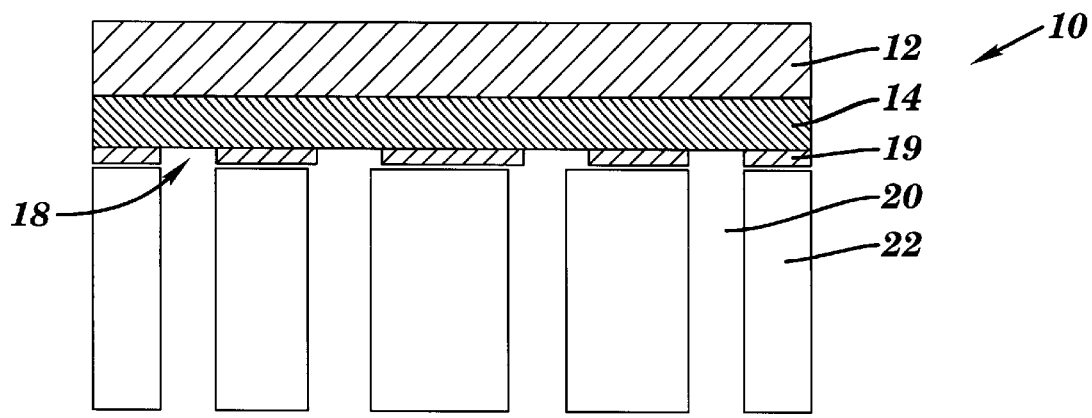
FIG. 4 depicts the carrier structure of FIG. 3 mated with a substrate in accordance with the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Referring to the drawings, FIGS. 1–3 show the formation of a carrier structure 10 used to fill apertures or vias within a substrate, such as a chip carrier, circuit board, etc. In particular, FIG. 1 shows a sacrificial first layer 12 having a layer of fill material 14 thereon. The sacrificial first layer 12 comprises copper foil, aluminum, other similarly used metals, or alternatively a non-metal, such as polyamide, polymer film, etc. The sacrificial first layer 12 has a thickness in the range of approximately 0.5–5.0 mil.

The layer of fill material 14 comprises an organic material, such as an epoxy, cyanate ester, bismaleimide, cyanate esterepoxy, polyamide, benzocyclobutenes, polysulfones, polyetherketones, and combinations thereof. The fill material 14 may also include thermally or electrically conductive particles, such as silica, alumina, aluminum nitride, silicon nitride, silicon carbide, boron nitride, diamond powder, glass, silver, gold, paladium, tin, bismuth, lead, transient liquid phase particles, silver coated copper, silver coated solid glass spheres, silver coated hollow glass spheres, carbon, nickel, molybdenum and platinum, etc., distributed therein. The fill material 14 may also consist of materials cited in x U.S. Pat. No. 6,106,891 to Kulesza et al., assigned to IBM (International Business Machines Corporation), which is incorporated herein by reference. The layer of fill material 14, having a thickness in the range of approximately 0.5–5.0 mil., is deposited over the sacrificial first layer 12 using a roller coating technique, a print screening technique, or other conventional process. In particular, the fill material 14 is heated to a temperature in the range of approximately 120–140° C. to remove any solvent used in the fill material 14, (which aids in the coating process), and to partially advance the fill material 14, thereby liquefying the fill material 14 so that it will adhere to the sacrificial first layer 12.

As illustrated in FIG. 2, a layer of foil 16 is deposited over the layer of fill material 14 using a transfer type technique, such as roll lamination, vacuum lamination, hot roll lamination (HRL), etc. The deposition process is performed at a low temperature and pressure in order to prevent the layer of fill material 14 from being deformed or displaced. The layer of foil 16 is deposited having a thickness in the range of approximately 0.25–2.0 mil. The layer of foil 16 comprises copper or other similarly used materials.

As shown in FIG. 3, holes or openings 18 are formed within the layer of foil 16 thereby forming a mask 19. The openings 18 within the layer of foil 16 may be formed using conventional photolithographic subtractive etching methods, or other similar processes. The openings 18, which expose portions of the fill material 14, correspond to the approximate size and location of apertures or vias 20, such as plated through holes, formed within a substrate 22, such as a chip carrier, circuit board, etc., (shown in FIG. 4). The substrate 22 may comprise FR-4 epoxy and laminates based on high temperature resins such as high temperature epoxies, polyimides, cyanates (triazines), fluoropolymers, ceramic filled fluoropolymers, benzocyclobutenes, perfluorobutanes, polyphenylenesulfide, polysulfones, polyetherimides, polyetherketones, polyphenylquinoxalines, polybenzoxazoles, and polyphenyl benzobisthiazoles, combinations thereof and the like. The openings 18 in the layer of foil 16 are formed using conventional circuitization techniques, such as photolithographic, or other methods. For instance, the apertures 20 may be formed by drilling, punching or laser techniques conventionally used for providing a printed circuit board or a chip carrier.

As shown in FIG. 4, the carrier structure 10 is inverted and placed on the surface of the substrate 22 such that the mask 19 is in contact with the substrate 22. As illustrated, the openings 18 in the mask 19 do not need to be perfectly aligned with, or have the exact same dimensions as, the apertures 20 in the substrate 22. As long as the openings 18 in the mask 19 provide approximately 20–80% access between the fill material 14 and the apertures 20 within the substrate 22, the apertures 20 will be properly filled (as will be discussed herein).

Figure 5:
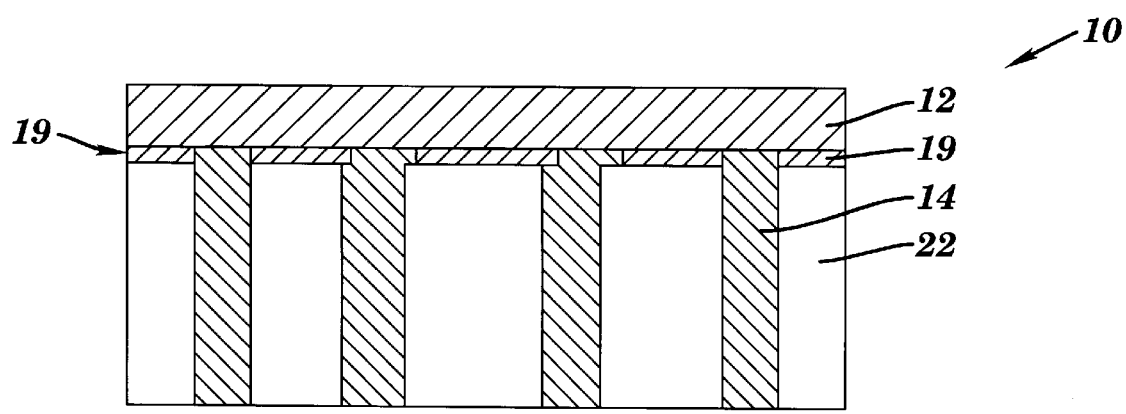
FIG. 5 depicts the carrier structure and the substrate of FIG. 4 following filling of apertures in the substrate in accordance with the present invention.
Figure 6:
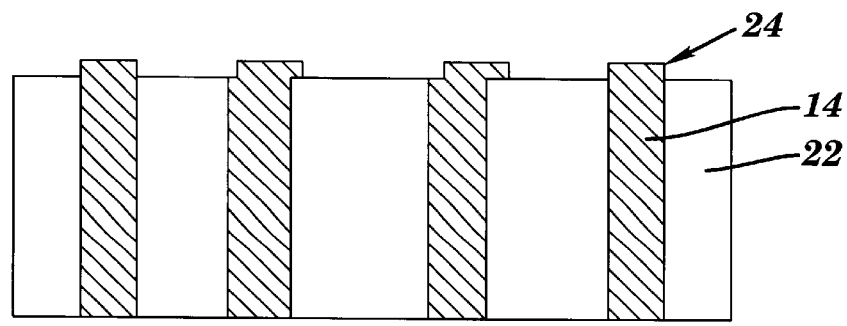
FIG. 6 depicts the substrate of FIG. 5 following removal of the carrier substrate in accordance with the present invention.
Figure 7:
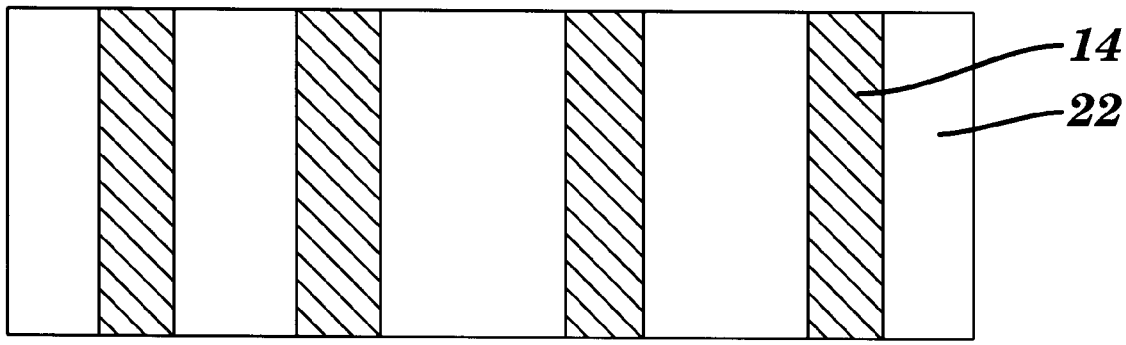
FIG. 7 depicts the substrate of FIG. 6 following planarization in accordance with the present invention.

Pressure in the range of approximately 150–700 psi, and a temperature in the range of approximately 80–200° C., e.g., 120–130° C., are applied for about 20-90 minutes to force the fill material 14 through the openings 18 in the mask 19 and into the apertures 20 of the substrate 22 and cure the fill material 14 displaced into the apertures 20 (FIG. 5). The sacrificial first layer 12, the mask 19, and any remaining fill material 14 therebetween, are then removed from the surface of the substrate 22 using a peeling technique, which induces a shearing force on the fill material 14 within the apertures 20. During peeling the fill material 14 that is within the openings 18 of the mask 19 and is adhered to the sacrificial first layer 12 is broken leaving nubs 24 on the surface of the substrate 22 (FIG. 6). The surface of the substrate 22 is then planarized using abration, mechanical scrubbing, CMP (chemical mechanical polishing), etc., to remove the nubs 24, as shown in FIG. 7.

Figure 8:
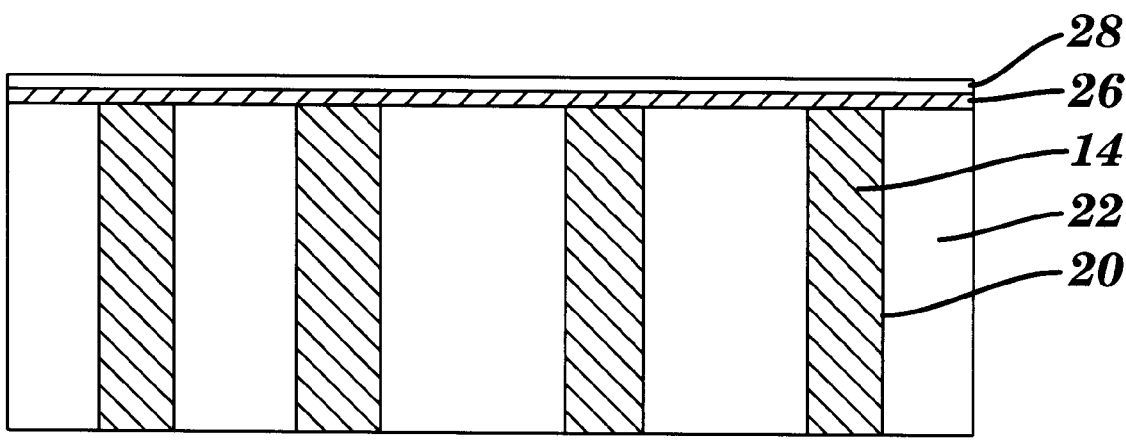
FIG. 8 depicts the substrate of FIG. 7 having a wiring layer and an insulative layer thereon in accordance with the present invention.

Thereafter, a layer of conductive material, such as copper, is plated onto the surface of the substrate 22, using conventional plating techniques (FIG. 8). This forms a capping layer over the filled apertures 20. The conductive layer 26 is then patterned to form a wiring layer 26 for electrical connections. Thereafter, an insulation dielectric layer or a dielectric build-up layer 28, is laminated to the wiring layer 26. The dielectric build-up layer 28 provides for the stacking of additional circuit layers.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A structure used to fill an at least one aperture within a semiconductor substrate, comprising:
   a first layer;
   a layer of fill material over the first layer; and
   a mask over the layer of fill material.

2. The structure of claim 1, wherein the first layer comprises a material selected from the group consisting of: copper foil, aluminum, polyamide and polymer film.

3. The structure of claim 1, wherein the fill material comprises a material selected from the group consisting of: an epoxy, cyanate ester, bismaleimide, cyanate ester-epoxy, polyamide, benzocyclobutenes, polysulfones, polyetherketones, and combinations thereof.

4. The structure of claim 3, wherein the fill material further comprises particles selected from the group consisting of: silica, alumina, aluminum nitride, silicon nitride, silicon carbide, boron nitride, diamond powder, glass, copper, silver, gold, paladium, tin, bismuth, lead, transient liquid phase particles, silver coated copper, silver coated solid glass spheres, silver coated hollow glass spheres, carbon, nickel, molybdenum and platinum.

5. The structure of claim 1, wherein the mask further comprises at least one opening that at least partially aligns with the aperture in the substrate.

6. The structure of claim 1, wherein the opening aligns with the aperture in the substrate to provide at least 20–80% access between the fill material and the aperture.

7. The structure of claim 1, wherein the mask has a thickness in the range of approximately 0.25–2 mil.

* * * * *